(12) United States Patent
Chin et al.

(10) Patent No.: US 7,205,575 B2
(45) Date of Patent: Apr. 17, 2007

(54) HIGH BRIGHTNESS LIGHT EMITTING DIODE

(75) Inventors: Yuan-Cheng Chin, Hsintien (TW); Hung-Chih Li, Taichung (TW)

(73) Assignees: Unity Opto Technology Co., Ltd., Taipei Hsien (TW); Genius Electronic Optical Co., Ltd., Taichung (TW)

( * ) Notice: Subject to any disclaimer, the term of this patent is extended or adjusted under 35 U.S.C. 154(b) by 0 days.

(21) Appl. No.: 10/945,869

(22) Filed: Sep. 22, 2004

(65) Prior Publication Data

US 2006/0060905 A1    Mar. 23, 2006

(51) Int. Cl.
*H01L 29/24* (2006.01)

(52) U.S. Cl. .......................................... 257/88; 257/101
(58) Field of Classification Search ........... 257/79–103
See application file for complete search history.

(56) References Cited

U.S. PATENT DOCUMENTS 6,989,555 B2 * 1/2006 Goetz et al. ................. 257/101

2005/0230692 A1 * 10/2005 Kim et al. .................... 257/79

* cited by examiner

*Primary Examiner*—Cuong Nguyen
(74) *Attorney, Agent, or Firm*—Troxell Law Office, PLLC

(57) ABSTRACT

A high brightness light emitting diode (LED) includes a base, a reflector cap, LED dices, a plastic layer, a lens, and a silicon rubber layer. Conductive terminals extend from the base for connection with an external power source. The base defines a bore receiving the cap with a bottom of the cap exposed. The cap forms a cavity receiving the LED dices, which are electrically connected to the conductive terminals. The plastic layer comprising PPA, LCP, or engineer plastics is filled in the cavity o with ends of the terminals extending beyond the plastic layer. The lens is positioned over the plastic layer and has projections that snugly fit over and engage the base. The silicon rubber layer is interposed between the lens and the base. With such an arrangement, lights from the LED dices can be mixed twice for enhanced uniformity of brightness of the light distribution.

4 Claims, 5 Drawing Sheets

HIGH BRIGHTNESS LIGHT EMITTING DIODE

FIELD OF THE INVENTION

The present invention generally relates to a high brightness light emitting diode (HB LED), and in particular to an LED comprising a plurality of different color LED dices positioned in a reflector cap that provides primary mixture of color lights from the LED dices and a lens having projections fit over the reflector cap to provide secondary mixture of the color lights whereby a uniform distribution of high brightness light can be obtained for better utilization in wide applications of different lighting requirements, such as lighting for shopping malls, lighting for exhibition, lighting for advertisement boards, as well as a variety of lighting devices, and backlight devices.

BACKGROUND OF THE INVENTION

A conventional light emitting diode (LED), such as that shown in FIG. 5 of the attached drawings, comprises a base 8 having opposite edges from which conductive terminals 81 extending for connection with an external power source. The base 8 defines a cavity 82 in which a plurality of LED dices 83 that gives off light of different colors is positioned. Conductors 82 electrically connect the LED dices 83 to the terminals 81. A plastic package 5 is formed around the cavity 82 to cover and shield the LED dices 83. Lights of different colors from the LED dices 83 are mixed before projected out of the plastic package 5. Although mixture of the lights of different colors can be done in such a conventional construction, such mixture is not satisfactorily uniform.

SUMMARY OF THE INVENTION

Thus, a primary objective of the present invention is to provide a high brightness (HB) light emitting diode (LED), comprising a reflector cap for supporting LED dices of different colors and providing primary mixture of the lights from the LED dices and a lens having depending projections fit over the cap for performing secondary mixture over the lights from the LED dices whereby uniform distribution of high brightness light can be realized.

Another objective of the present invention is to provide a high brightness light emitting diode comprising a lens forming projections for stably mounting the lens over a reflector cap that supports LED dices and defining gas expelling openings through which gas inside the cap can be effectively expelled when plastic packaging is performed over the LED.

To achieve the above objective, in accordance with the present invention, a high brightness light emitting diode (LED) comprising a base, a reflector cap, a plurality of LED dices, a plastic layer, a lens, and a silicon rubber layer. Conductive terminals extend from the base for connection with an external power source. The base defines a bore receiving and retaining the cap with a bottom of the cap exposed in the bottom of the base. The cap forms a cavity receiving and fixing the LED dices, which are electrically connected to the conductive terminals. The plastic layer comprising PPA, LCP, or engineer plastics is filled in the cavity o with ends of the terminals extending beyond the plastic layer. The lens is positioned over the plastic layer and has projections that snugly fit over and engage the base. The silicon rubber layer is interposed between the lens and the base. With such an arrangement, lights from the LED dices can be mixed twice for enhanced uniformity of brightness of the light distribution.

BRIEF DESCRIPTION OF THE DRAWINGS

The present invention will be apparent to those skilled in the art by reading the following description of a preferred embodiment thereof, with reference to the attached drawings, in which.

DETAILED DESCRIPTION OF THE PREFERRED EMBODIMENT

Figure 1:
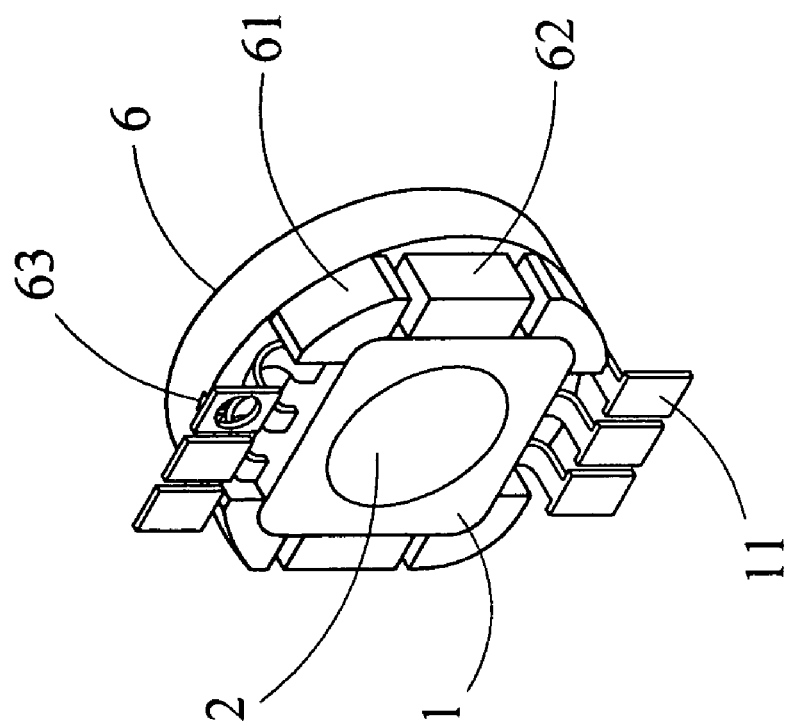
FIG. 1 is a perspective view of a high brightness light emitting diode constructed in accordance with the present invention.
Figure 2:
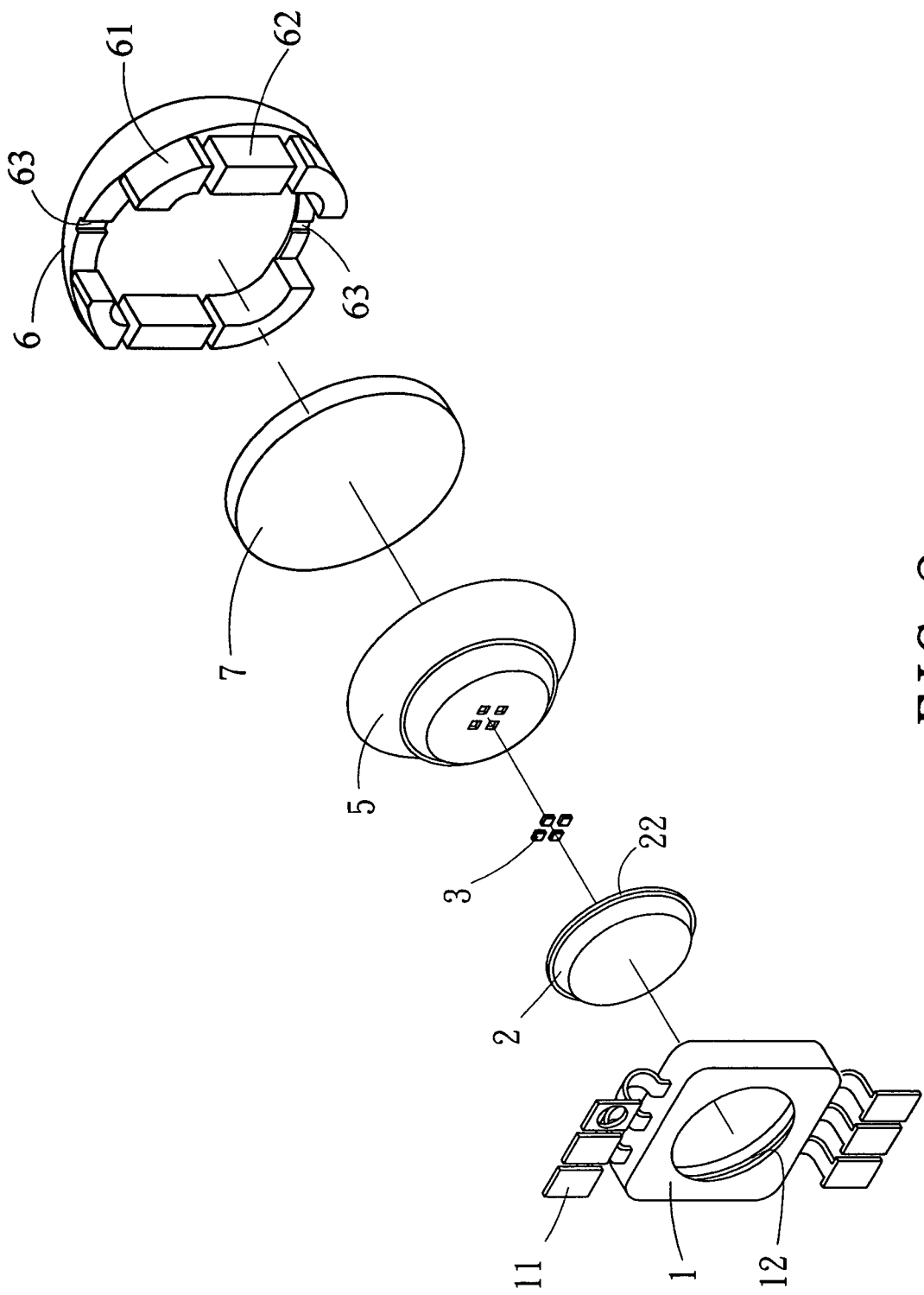
FIG. 2 is an exploded view of the high brightness light emitting diode of the present invention.
Figure 3:
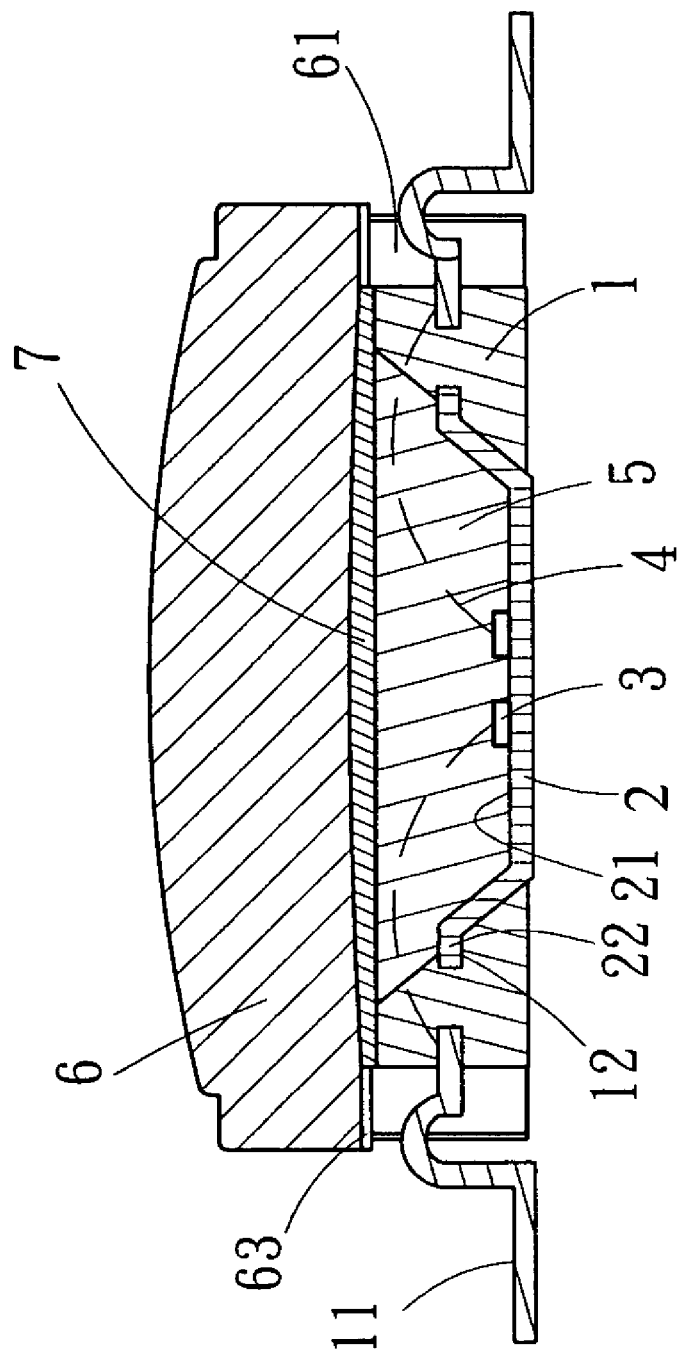
FIG. 3 is a cross-sectional view of the high brightness light emitting diode of the present invention.

With reference to the drawings and in particular to FIGS. 1–3, a high brightness (HB) light emitting diode (LED) constructed in accordance with the present invention comprises a base 1 having opposite edges (not labeled) from which conductive terminals 11 extend for connection with an external power source (not shown). The base 1 forms a bore (not labeled) having a circumferential side wall in which a circumferentially extending groove 12 is defined.

A reflector cap 2 is received in the bore of the base 1 with a bottom of the cap 2 exposed in a bottom surface of the base 1. The cap 2 forms a cavity 21 circumferentially surrounded by an inclined side wall from which a circumferential flange 22 extend. The flange 22 is received in and engages the groove 12 to secure the cap 2 in the bore of the base 1. The cap 2 can be made of ceramics, plastics or metals, which allows for reflection of light.

The HB LED comprises a plurality of LED dices 3, which give off lights of different colors, including at least red, blue, and green lights. The LED dices 3 are positioned and retained in the cavity 21 of the cap 2 and are electrically connected to the conductive terminals 11 by conductors 4 that are also arranged in the cap 2. The lights from the LED dices 3 can be reflected by the cap 2 for primary mixture.

Plastics for packaging purposes, such as PPA, LCP, and engineer plastics, are filled in the cavity 21 of the cap 2 and surrounds and shield the cap 2, the LED dices 3, and the conductors 4 as well as the conductive terminals 11. However, it is noted that the conductive terminals 11 are allowed to extend beyond the plastic layer 5 for connection with the external power source. The bottom of the cap 2 is also not covered by the plastics 5 and remains exposed in the bottom surface of the base 1.

A lens 6 is positioned over the plastic layer 5 with a layer of silicon rubber 7 interposed therebetween. The lens 6 comprises projections 61, 62 extending from a bottom circumference of the lens 6 for snugly fitting over and engaging the base 1. Openings 63 are defined in the bottom circumference of the lens 6 for expelling gas inside the cap 2 during plastic packaging and filling into the LED.

Figure 4:
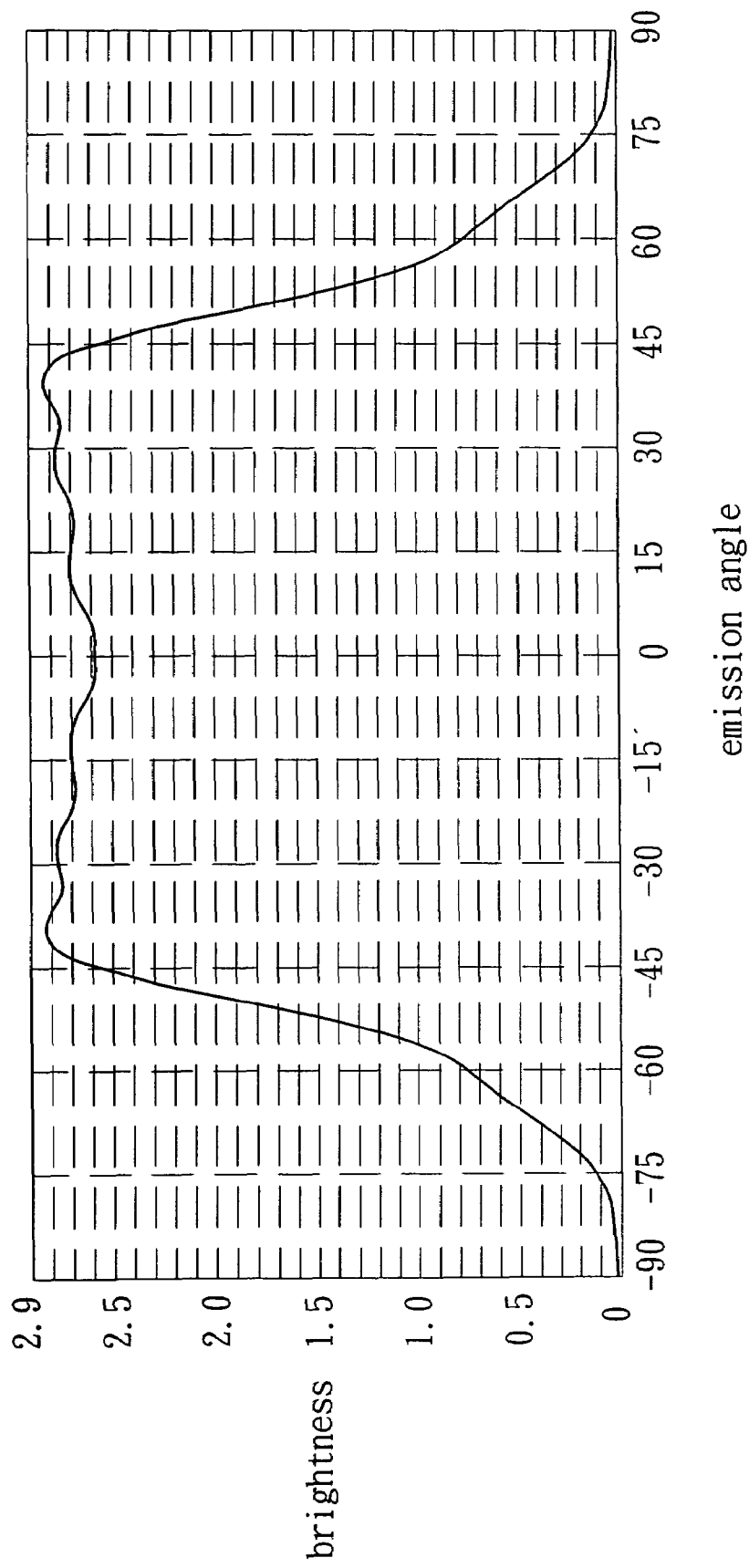
FIG. 4 shows a plot of brightness of the light emitted from the light emitting diode of the present invention vs. emission angle thereof, illustrating the superior uniformity of the light distribution emitted from the light emitting diode of the present invention.
Figure 5:
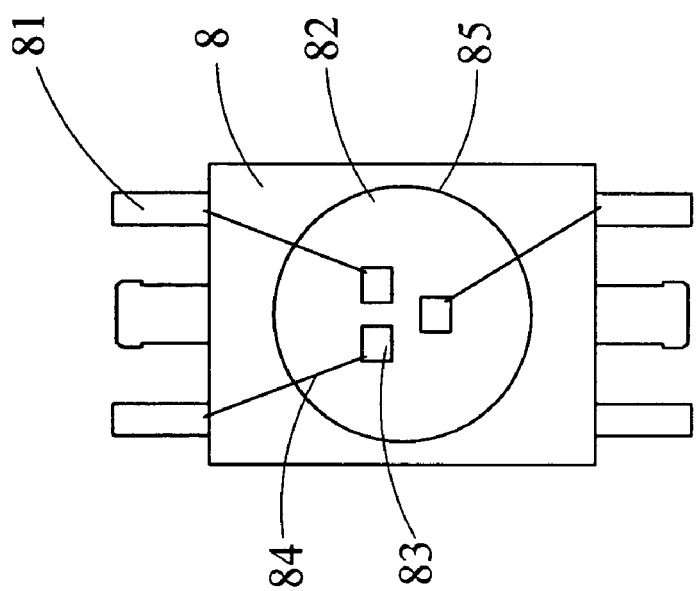
FIG. 5 is a plan view showing a conventional light emitting diode package.

The HB LED in accordance with the present invention has the following features. The reflector cap 2 forming the cavity 21 for receiving and retaining at least red color, blue color, and green color LED dices 3 provides the primary mixture for the color lights from the LED dices 3. In addition to the primary mixture, a secondary mixture of the lights from the LED dices 3 is provided by the lens 6 having projections 61, 62 that fit over and engage the base 1. Extremely uniform of light distribution is thus realized by employing both the primary and secondary mixtures. FIG. 4 shows a plot of the brightness of the light distribution resulting from the primary and secondary mixtures with respect to different emission angles. It is clear from the plot that the light has a quite uniform distribution in the range from −45 degrees to 45 degrees. Further, the gas expelling openings 63 defined in the bottom of the lens 6 enhances plastic filling operation of the LED, for further improving the uniformity of light distribution of the LED of the present invention.

Although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A high brightness light emitting diode comprising:
   a base defining a bore and comprising conductive terminals extending therefrom;
   a reflector cap received and retained in the bore with a bottom of the cap exposed in a bottom face of the base, the cap forming a cavity;
   LED dices positioned in the cavity and electrically connected to the conductive terminals;
   a plastic layer filled in and surrounding and shielding the reflector cap and the LED dices and partly surrounding the terminals with ends of the terminals extending beyond the plastic layer and the bottom of the cap remaining exposed in the bottom face of the base;
   a lens positioned over the plastic layer and comprising projections extending therefrom for snugly fitting over and engaging the base; and
   a layer of silicon rubber interposed between the lens and the plastic layer;
   whereby lights from the LED dices are mixed twice so as to provide high brightness light of extremely uniformly distribution from the LED.

2. The high brightness light emitting diode as claimed in claim 1, wherein a gas expelling opening is defined in a bottom of the lens.

3. The high brightness light emitting diode as claimed in claim 1, wherein a circumferential groove is defined in a side wall of the bore of the base for receiving and engaging a flange extending from the cap so as to secure the cap in the bore.

4. The high brightness light emitting diode as claimed in claim 1, wherein the LED dices comprise red light, blue light, and green light LED dices.

* * * * *